United States Patent [19]
Hennig

[11] Patent Number: 5,406,130
[45] Date of Patent: Apr. 11, 1995

[54] CURRENT DRIVER WITH SHUTDOWN CIRCUIT
[75] Inventor: Bruce L. Hennig, San Jose, Calif.
[73] Assignee: Micrel, Inc., San Jose, Calif.
[21] Appl. No.: 104,319
[22] Filed: Aug. 9, 1993
[51] Int. Cl.[6] .......................... H03K 17/56; H03K 3/01
[52] U.S. Cl. ........................................ 327/108; 327/50
[58] Field of Search ........................ 307/246, 270, 572

[56] References Cited
U.S. PATENT DOCUMENTS

| | | | |
|---|---|---|---|
| 5,138,515 | 8/1992 | Bourgeois | 307/270 |
| 5,270,686 | 12/1993 | Tisirger | 307/270 |
| 5,272,392 | 12/1993 | Wong et al. | 307/270 |
| 5,272,399 | 12/1993 | Tihanyi et al. | 307/270 |

Primary Examiner—Margaret Rosl Wambach
Attorney, Agent, or Firm—Skjerven, Morrill, MacPherson, Franklin & Friel; Brian D. Ogonowsky

[57] ABSTRACT

A circuit in accordance with the present invention includes a current driver circuit whose drive current is sensed by a threshold circuit. The threshold circuit, upon detecting an excess of current through the current driver circuit, controls a shutdown circuit for shutting down the current driver circuit. In the preferred embodiment, the shutdown circuit portion includes a delay circuit which prevents normal transient current spikes from triggering the shutdown circuit.

8 Claims, 1 Drawing Sheet

CURRENT DRIVER WITH SHUTDOWN CIRCUIT

BACKGROUND OF THE INVENTION

1. Field of the Invention

The invention relates to a method and apparatus for driving current through a load while protecting the current driver and load from excessive and damaging currents.

2. Description of Related Art

A typical current driver for a load includes a large bipolar or MOS transistor in series with the load such that conduction by the driver transistor causes a certain current to flow through the load. A terminal of the load may be connected to a load voltage $V_L$, and a terminal of the current driver transistor may be connected to a reference voltage so that the current flows from the load voltage terminal to the reference voltage terminal through the load and the current driver.

The current through the load depends on the fluctuation of the load voltage $V_L$ and reference voltage, the conductance of the load, and the conductance of the current driver.

To protect from excessive and damaging currents flowing through the load and current driver, a current limiting circuit is frequently coupled to the control terminal of the current driver for maintaining a relatively constant current flowing through the load or otherwise for limiting the current flowing through the load. However, when the load fails and becomes a low resistance, or when the power supply fails and provides an excessively high load voltage, it is then desirable that the current driver be completely shut down until the problem is fixed. It is also desirable that normal transient power supply spikes or other normal transient over-current conditions not result in the shutdown of the current driver, since such transient conditions are not damaging to the load.

SUMMARY

A circuit in accordance with the present invention includes a current driver circuit whose drive current is sensed by a threshold circuit. The threshold circuit, upon detecting an excess of current through the current driver circuit, controls a shutdown circuit for shutting down the current driver circuit. In the preferred embodiment, the shutdown circuit portion includes a delay circuit which prevents normal transient current spikes from triggering the shutdown circuit. Additionally, the threshold circuit operates to trigger the shutdown circuit with a minimum delay if a very high current is sensed and operates to trigger the shutdown circuit after a longer delay if a lower, but still excessive, current is sensed. In this way, the threshold circuit and delay circuit allow for the occurances of temporary, but non-damaging, current surges without shutting down the driver circuit.

Also, in the preferred embodiment, the shutdown circuit includes a resettable latch which, when triggered, shuts down the current driver circuitry until reset by an external pulse to enable the current driver circuitry.

DETAILED DESCRIPTION OF THE PREFERRED EMBODIMENT

Figure 1:
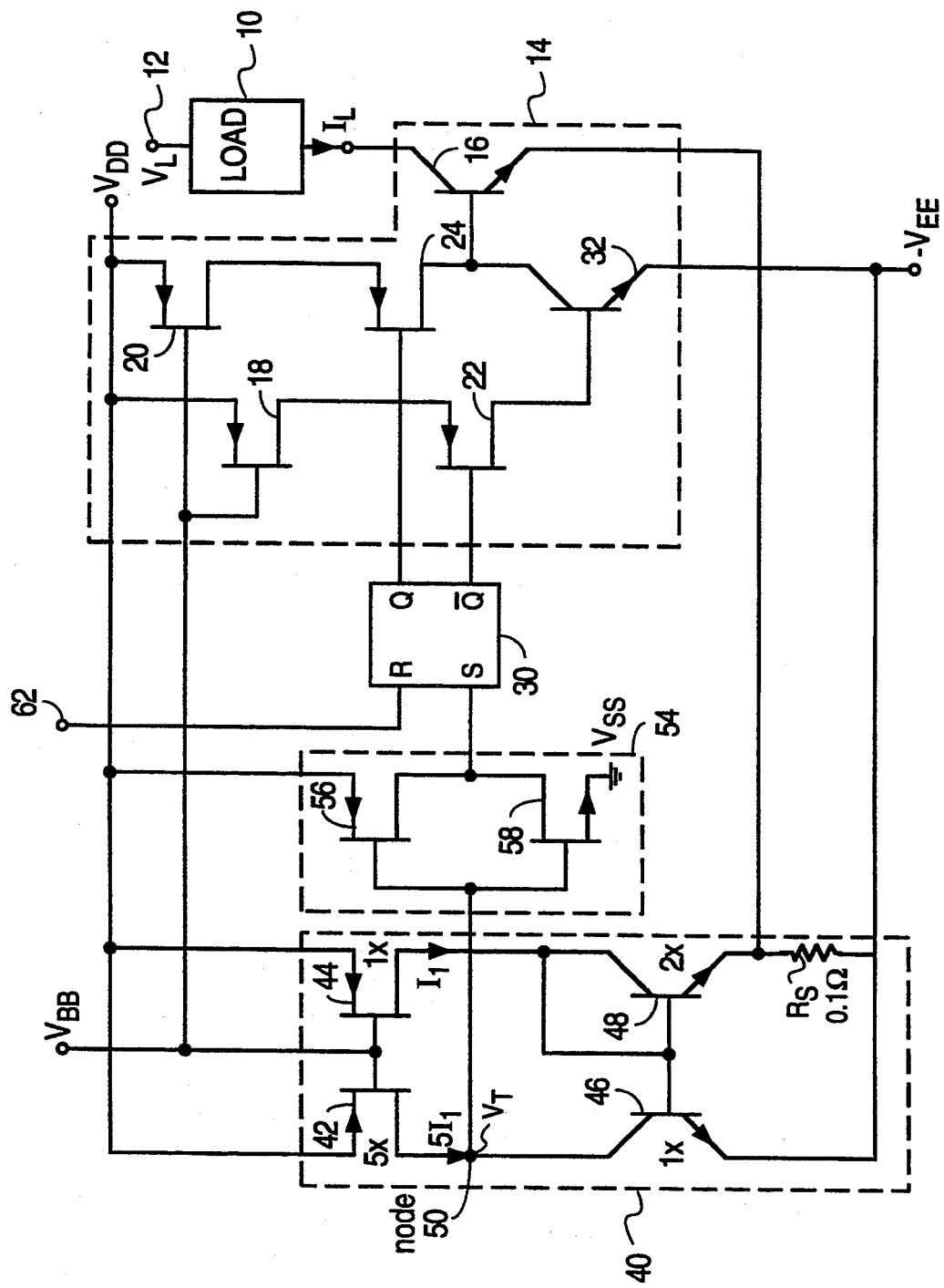
FIG. 1 is a schematic diagram incorporating one embodiment of the invention.

FIG. 1 is a preferred embodiment of a current driver and a shutdown circuit in accordance with the present invention. In FIG. 1, a load 10 has a terminal 12 connected to a load voltage $V_L$.

A current driver circuit 14 determines the amount of current which flows through load 10. Current driver circuit 14 includes a bipolar driver transistor 16 having its collector coupled to a terminal of load 10 and its emitter coupled to a negative supply voltage $-V_{EE}$ through a small value series resistor $R_S$. The base of driver transistor 16 is coupled to a current source transistor 20, which regulates the current applied to the base of driver transistor 16 to prevent power supply voltage fluctuations from significantly affecting the conductivity of driver transistor 16.

Within current driver circuitry 14, PMOS transistors 18 and 20 have their sources coupled to a positive power supply voltage $V_{DD}$ and have their gates commonly coupled to a bias voltage source $V_{BB}$. PMOS transistors 18 and 20 act as current sources.

PMOS transistors 22 and 24 are respectively connected in series with PMOS transistors 18 and 20. PMOS transistors 22 and 24 act as switches, wherein PMOS transistor 22 is turned on when the $\overline{Q}$ output of flip flop 30 is low, and PMOS transistor 24 is turned on when the Q output of flip flop 30 is low. A high voltage applied to a gate of PMOS transistor 22 or 24 by flip flop 30 causes that transistor to be off. Accordingly, given the inverted outputs of flip flop 30, one of PMOS transistors 22 and 24 will be on, while the other of transistors 22 and 24 will be off.

The drain of PMOS transistor 24 is connected to the base of driver transistor 16 so that when PMOS transistor 24 is turned on, driver transistor 16 is made conductive. The base of driver transistor 16 is also coupled to the collector of a bipolar pull-down transistor 32. The drain of PMOS transistor 22 is coupled to the base of pull-down transistor 32 to control pull-down transistor 32 to be on or off.

Thus, a high Q output of flip flop 30 in conjunction with a low $\overline{Q}$ output of flip flop 30 causes transistor 24 to be off and transistor 22 to be on, thus causing bipolar transistor 32 to pull down the base of driver transistor 16 to shut down driver transistor 16. Conversely, a low Q output and a high $\overline{Q}$ output of flip flop 30 causes transistor 24 to be on and transistor 22 to be off, thus raising the base voltage of driver transistor 16 to cause driver transistor 16 to draw the full current through load 10.

Current driver circuit 14 provides a number of advantages over conventional current driver circuits in that the circuit allows the emitter of the driver transistor 16 and the emitter of the pull-down transistor 32 to be connected to a negative supply voltage $(-V_{EE})$ which can be as low as $-20$ volts. This configuration also provides well-controlled currents through PMOS transistors 22 and 24 over the full power supply voltage $V_{DD}$ range of, for example, 5 volts through 12 volts. Hence, this configuration allows the simultaneous application of a high positive $V_{DD}$ and a high negative $V_{EE}$ supply voltage so that the circuit of FIG. 1 may be used with a wide variety of supply voltages conventionally used in today's environment.

A threshold circuit 40 is connected so as to detect the voltage across a small-value resistor $R_S$ corresponding to the current $I_L$ through load 10. The small value (e.g., 0.1 ohm) resistor $R_S$ is connected in series between the emitter of driver transistor 16 and the negative supply voltage $-V_{EE}$. An increased load current $I_L$ will cause the voltage drop across resistor $R_S$ to increase proportionally.

Within threshold circuit 40, PMOS transistors 42 and 44 have their gates connected to bias voltage $V_{BB}$ and their sources coupled to the power supply voltage $V_{DD}$. Transistors 42 and 44 are sized such that transistor 42 provides a current which is five times that of the current through transistor 44 under the same operating conditions.

Bipolar transistors 46 and 48 have their collectors connected to the drains of transistors 42 and 44, respectively. The bases of bipolar transistors 46 and 48 are made common and coupled to the drain of PMOS transistor 44 so that both transistors 46 and 48 will receive the same base voltage. Transistor 48 is sized to draw twice as much current as transistor 46 with an identical base-emitter voltage $V_{BE}$.

Threshold circuit 40 operates as follows. Assuming the current $I_L$ through load 10 is zero, there will be essentially no voltage drop across resistor $R_S$, and thus the emitters of transistors 46 and 48 will have the same voltage applied to them.

Since transistor 48 has its base connected to the drain of transistor 44 and transistor 44 acts as a current source providing a current $I_1$ to the collector of transistor 48, the $V_{BE}$ of transistor 48 will be such that transistor 48 conducts a current of approximately $I_1$. Since transistor 48 is twice as large as transistor 46 and has the same $V_{BE}$ as transistor 48, the current through transistor 46 will be 0.5 $I_1$.

Given the large excess of current provided by PMOS transistor 42, the voltage at node 50 (the drain of transistor 42) will be at a relatively high voltage level. The voltage at node 50 will be referred to as $V_T$.

Node 50 is coupled to an input of a delay circuit 54 which, in the embodiment shown in FIG. 1, is a CMOS device having certain structural characteristics. Delay circuit 54 comprises a PMOS transistor 56 coupled in series with an NMOS transistor 58 between the power supply voltage $V_{DD}$ and ground voltage $V_{SS}$. The gates of transistors 56 and 58 are coupled to node 50 such that, when node 50 is high, transistor 56 is off and transistor 58 is on, pulling the output of the CMOS device to a low voltage. The delay properties of delay circuit 54 will be discussed later.

An output of delay circuit 54 is coupled to the set terminal of flip flop 30, wherein a high voltage applied to the set terminal of flip flop 30 causes the Q output to be a high voltage and the $\overline{Q}$ output to be a low voltage to shut down the driver transistor 16.

Assuming flip flop 30 is in its normal operating reset state, if the voltage $V_T$ at node 50 is a high voltage, a low voltage will be applied by delay circuit 54 to the set terminal of flip flop 30, and flip flop 30 will remain in its reset condition. In this state, the Q output will be low and the $\overline{Q}$ output will be high so as to cause a high base voltage to be applied to driver transistor 16 to draw a current $I_L$ through load 10.

If, for any variety of reasons, an excessively large current is drawn through load 10 due to, for example, a short through load 10, or a large voltage fluctuation in the voltage $V_L$ or $V_{EE}$, this increased current will flow through resistor $R_S$ to raise the emitter voltage of transistor 48 above the emitter voltage of transistor 46. This will cause the base voltage of transistor 48 to be raised to maintain the $I_1$ current flow through transistor 48. Since the base of transistor 46 is connected to the base of transistor 48, the increased base voltage of transistor 46 causes transistor 46 to draw a greater current through PMOS transistor 42. If the $V_{BE}$ of transistor 46 were sufficiently high, all current supplied by PMOS transistor 42 would be drawn through transistor 46 to cause voltage $V_T$ to be at a relatively low voltage. This low voltage $V_T$ would be inverted by delay device 54 and cause a high signal to be applied to the set terminal of flip flop 30 to shut down driver transistor 16. Flip flop 30 would then need to be reset using an external pulse applied to reset terminal 62.

The value of resistor $R_S$ and the relative sizes of transistors 42, 44, 46, and 48 are set to cause flip flop 30 to be triggered at a level of current through load 10 which would be considered excessive. In the example of FIG. 1, threshold circuitry 40 is designed such that a 60 mV drop across resistor $R_S$ (i.e., $I_L$ equals 600 mA) will result in the conductivity of transistor 46 to increase by ten fold over the zero $I_L$ condition. Since, with a zero $I_L$ the initial current flowing through transistor 46 is 0.5 $I_1$, an increase in conductivity of transistor 46 by ten fold will draw all of the $5I_1$ current from PMOS transistor 42. This will pull voltage $V_T$ sufficiently low to turn on PMOS transistor 56 (after some delay) so as to set flip flop 30 and shut down driver transistor 16.

The operation of delay circuit 54 will now be described in greater detail. It is undesirable for momentary current spikes through load 10 to cause a shutdown of driver transistor 16. This is because transient current spikes below a certain level (such as due to power supply noise) will not be harmful to load 10 or to driver transistor 16, and such transients are generally a normal occurrence. To avoid momentary drops in $V_T$ from triggering flip flop 30, PMOS transistor 56 in delay circuit 54 is formed so as to have a relatively long channel. Such a long channel will require a relatively long time to charge the node capacitance at the transistor 56 drain to a voltage sufficient to set flip flop 30. The particular structural characteristics of PMOS transistor 56 needed to achieve a desired delay will be well-known to those skilled in the art. The extent of the delay would, of course, be dependent upon the tolerable transient levels. In one embodiment, a high current condition (i.e., over 600 mA) must exist for over 2 microseconds before the low $V_T$ output of threshold circuit 40 causes delay circuit 54 to set flip flop 30. If the high current condition is removed within 2 microseconds, flip flop 30 is not set.

Although the delay between a low $V_T$ voltage appearing at node 50 and a set signal appearing at flip flop 30 is made approximately 2 microseconds by the delay of conduction of PMOS transistor 56, the rate at which $V_T$ is pulled down from a high level is intentionally made very dependent upon the magnitude of the current $I_L$ through load 10. For example, a high voltage drop across resistor $R_S$ greater than, for example, 200 mV will cause transistor 46 to conduct a large amount of current within a very short period of time to quickly pull down $V_T$ to a low level and turn on PMOS transistor 56. Conversely, a voltage drop of approximately 60 mV across resistor $R_S$ will cause a level of conduction through transistor 46 such that there is approximately a 10 microsecond delay before $V_T$ is pulled down to a level necessary to turn on PMOS transistor 56. The relative sizes of the various transistors used and the value of $R_S$ may be selected to provide a desired rate of change of $V_T$ with changes in $I_L$.

Using the above circuitry, the shutdown of the driver transistor 16 is avoided during either relatively short (e.g., less than 2 microseconds) but high current surges, or slightly longer (e.g., 2-12 microseconds) but lower level current surges. In the event of a very high load current, such as a short circuit in the load 10, maximum protection is given to load 10 and to driver transistor 16 by shutting down driver circuit 16 within the minimum delay of only approximately 2 microseconds, incurred by delay circuit 54.

The various circuit modules comprising the current driver circuitry 14, the threshold circuitry 40, the delay circuitry 54, and the flip flop 30 may be substituted by similar circuits while still using the concepts of this present invention.

The various transistors described in the preferred embodiment of FIG. 1 may, of course, be opposite type transistors or may be transistors using other technologies, where the bipolar transistors may be MOS transistors and vice-versa.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A circuit for providing current to a load comprising:
   a current driver coupled to said load for drawing a current through said load;
   a threshold circuit coupled to said current driver for detecting a current through said load exceeding a certain level;
   a control circuit, coupled to said current driver and said threshold circuit, which responds to a first signal generated by said threshold circuit and disables said current driver when said threshold circuit detects a current through said current driver exceeding said certain level; and
   a delay circuit connected between said threshold circuit and said control circuit for providing a certain delay between receiving said first signal generated by said threshold circuit and applying a second signal to said control circuit to disable said current driver, said certain delay being such that said control circuit is not triggered by excessive load current conditions existing for less time than said delay provided by said delay circuit.

2. The circuit of claim 1 wherein said delay circuit comprises an MOS transistor having a gate connected to an output of said threshold circuit and having a channel length selected so as to provide said certain delay.

3. The circuit of claim 1 wherein an output of said threshold circuit is a first level when load currents are below said certain level and is a second level when load currents are above said certain level, said output at said second level being said first signal, a rate of change of said output of said threshold circuit between said first level and said second level being related to a magnitude of said current through said load, such that a delay incurred by said threshold circuit in providing said first signal to said delay circuit, after said threshold circuit has sensed a current through said load exceeding said certain level, is inversely related to a magnitude of said current through said load.

4. The circuit of claim 3 wherein said threshold circuit comprises a resistor connected in series between said load and a first power supply terminal such that a voltage drop across said resistor corresponds to a current through said load.

5. The circuit of claim 4 wherein said threshold circuit further comprises:
   a first transistor having a first terminal connected to said resistor and having a second terminal connected to a first current source, a control terminal of said first transistor being connected to said second terminal;
   a second transistor having a control terminal connected to said control terminal of said first transistor, having a first terminal connected to said first power supply terminal, and having a second terminal connected to a second current source, said second terminal providing said output of said threshold circuit,
   the relative sizes of said first and second transistors and said first and second current sources being selected to provide said delay incurred by said threshold circuit in providing said first signal to said delay circuit.

6. A circuit for providing current to a load comprising:
   a current driver coupled to said load for drawing a current through said load;
   a threshold circuit coupled to said current driver for detecting a current through said load exceeding a certain level; and
   a control circuit, coupled to said current driver and said threshold circuit, which responds to a first signal generated by said threshold circuit and disables said current driver when said threshold circuit detects a current through said current driver exceeding said certain level;
   wherein said control circuit includes a latch which is triggered in response to said first signal generated by said threshold circuit to disable said current driver until said latch is reset by application of a reset signal to said latch.

7. The circuit of claim 6 wherein said latch is a resettable flip flop with Q and $\overline{Q}$ outputs, said Q output of said latch being coupled to a first switch for turning on said current driver, said $\overline{Q}$ output of said latch being coupled to a second switch for disabling said current driver until said latch is reset.

8. The circuit of claim 7 wherein said first switch is connected to a power supply terminal via a first current source and said second switch is connected to said power supply terminal via a second current source, said first switch acting as a pull-up device for pulling up a control terminal of a current driver transistor, said second switch acting to control a pull-down device for pulling down said control terminal of said current driver transistor for disabling said current driver transistor.

* * * * *